(12) United States Patent
Takahashi

(10) Patent No.: US 10,447,239 B2
(45) Date of Patent: Oct. 15, 2019

(54) FILTER AND MULTIPLEXER

(71) Applicant: TAIYO YUDEN CO., LTD., Tokyo (JP)

(72) Inventor: Naoki Takahashi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 64 days.

(21) Appl. No.: 15/787,496

(22) Filed: Oct. 18, 2017

(65) Prior Publication Data

US 2018/0131348 A1 May 10, 2018

(30) Foreign Application Priority Data

Nov. 10, 2016 (JP) .................................. 2016-219893

(51) Int. Cl.
*H03H 9/64* (2006.01)
*H03H 9/145* (2006.01)
*H03H 9/25* (2006.01)
*H03H 9/02* (2006.01)
*H03H 9/72* (2006.01)

(52) U.S. Cl.
CPC ...... *H03H 9/6483* (2013.01); *H03H 9/02992* (2013.01); *H03H 9/1457* (2013.01); *H03H 9/25* (2013.01); *H03H 9/6489* (2013.01); *H03H 9/725* (2013.01)

(58) Field of Classification Search
CPC ............. H03H 9/6483; H03H 9/02992; H03H 9/1457; H03H 9/25; H03H 9/6489; H03H 9/725
See application file for complete search history.

(56) References Cited

U.S. PATENT DOCUMENTS

2013/0113576 A1 5/2013 Inoue et al.
2014/0113571 A1 4/2014 Fujiwara et al.

FOREIGN PATENT DOCUMENTS

JP 2013-118611 A 6/2013
JP 2014-120841 A 6/2014

*Primary Examiner* — Stephen E. Jones
*Assistant Examiner* — Samuel S Outten
(74) *Attorney, Agent, or Firm* — Chen Yoshimura LLP

(57) ABSTRACT

A filter includes: a piezoelectric substrate; input and output pads located on the piezoelectric substrate; a series resonator located in a region sandwiched between the input and output pads and located on the piezoelectric substrate and electrically connected in series between the input and output pads; a parallel resonator located in the region and electrically connected in parallel between the input and output pads; a longitudinally coupled acoustic wave resonator located on the piezoelectric substrate and located at a side, at which one pad of the input and output pads is located, with respect to the region; a first wiring line located on the piezoelectric substrate and connecting the one pad to the longitudinally coupled acoustic wave resonator; a second wiring line located on the piezoelectric substrate and connecting another pad of the input and output pads to the longitudinally coupled acoustic wave resonator; and a separation part located in one of the first and second wiring lines and separating the one of the first and second wiring lines into first and second parts in a planar direction, a distance between the first and second parts being greater than a shortest distance among distances between the first and second wiring lines and the series resonator and the parallel resonator.

10 Claims, 20 Drawing Sheets

FIG. 13

|  | UNIT | FILTER A | | | FILTER B | |
| --- | --- | --- | --- | --- | --- | --- |
|  |  | Ca | Cb | DMS | Cb | DMS |
| PITCH P | [μm] | 3.83 | 3.71 | 3.84 | 3.76 | 3.86 |
| NUMBER OF PAIRS IN IDT | [PAIRS] | 11 | 6.5 | 1.0–12.5 | 8.5 | 2.0–11.5 |
| NUMBER OF PAIRS IN REFLECTOR | [PAIRS] | 5 | 5 | 5 | 5 | 5 |
| APERTURE LENGTH | [λ] | 15 | 6.5 | 6.1 | 7.6 | 7 |
| DUTY RATIO IN IDT | [%] | 50% | 50% | 50% | 50% | 50% |
| DUTY RATIO IN REFLECTOR | [%] | 50% | 50% | 50% | 50% | 50% |
| D3 | [μm] | 0.9575 | 0.9257 | – | 0.94 | – |
| CAPACITANCE | [pF] | 0.21 | 0.08 | – | 0.1 | – |
| D1 | [μm] | 6 | | | 0.9 | |
| D2 | [μm] | – | | | 51 | |
| W2 | [μm] | – | | | 41 | |

FILTER AND MULTIPLEXER

CROSS-REFERENCE TO RELATED APPLICATION

This application is based upon and claims the benefit of priority of the prior Japanese Patent Application No. 2016-219893, filed on Nov. 10, 2016, the entire contents of which are incorporated herein by reference.

FIELD

A certain aspect of the present invention relates to a filter and a multiplexer.

BACKGROUND

Acoustic wave filters and multiplexers using surface acoustic wave resonators have been used for mobile communication terminals. It has been known to use a cancel circuit to improve the attenuation characteristic of the acoustic wave filter and the attenuation characteristic and/or the isolation characteristic of the multiplexer as disclosed in, for example, Japanese Patent Application Publication Nos. 2013-118611 and 2014-120841.

Causing signals passing through a filter and signals passing through a cancel circuit to have opposite phases and the same amplitude improves the attenuation characteristic and/or the isolation characteristic in the attenuation range. However, the use of the cancel circuit deteriorates the attenuation characteristic in other than the attenuation range.

SUMMARY OF THE INVENTION

According to a first aspect of the present invention, there is provided a filter including: a piezoelectric substrate; an input pad located on the piezoelectric substrate; an output pad located on the piezoelectric substrate; a series resonator located in a region, which is sandwiched between the input pad and the output pad and is located on the piezoelectric substrate, and electrically connected in series between the input pad and the output pad; a parallel resonator located in the region and electrically connected in parallel between the input pad and the output pad; a longitudinally coupled acoustic wave resonator located on the piezoelectric substrate, the longitudinally coupled acoustic wave resonator being located at a side at which one pad of the input pad and the output pad is located with respect to the region; a first wiring line located on the piezoelectric substrate and connecting the one pad to the longitudinally coupled acoustic wave resonator; a second wiring line located on the piezoelectric substrate and connecting another pad of the input pad and the output pad to the longitudinally coupled acoustic wave resonator; and a separation part located in one of the first wiring line and the second wiring line, the separation part separating the one of the first wiring line and the second wiring line into a first part and a second part in a planar direction, a distance between the first part and the second part being greater than a shortest distance among distances between the first wiring line and the second wiring line and the series resonator and the parallel resonator.

According to a second aspect of the present invention, there is provided a multiplexer including: the above filter.

BRIEF DESCRIPTION OF THE DRAWINGS

FIG. 13 presents dimensions and the like of the cancel line in each of the filters A and B;

DETAILED DESCRIPTION

Hereinafter, embodiments of the present invention will be described with reference to the accompanying drawings.

First Embodiment

Figure 1:
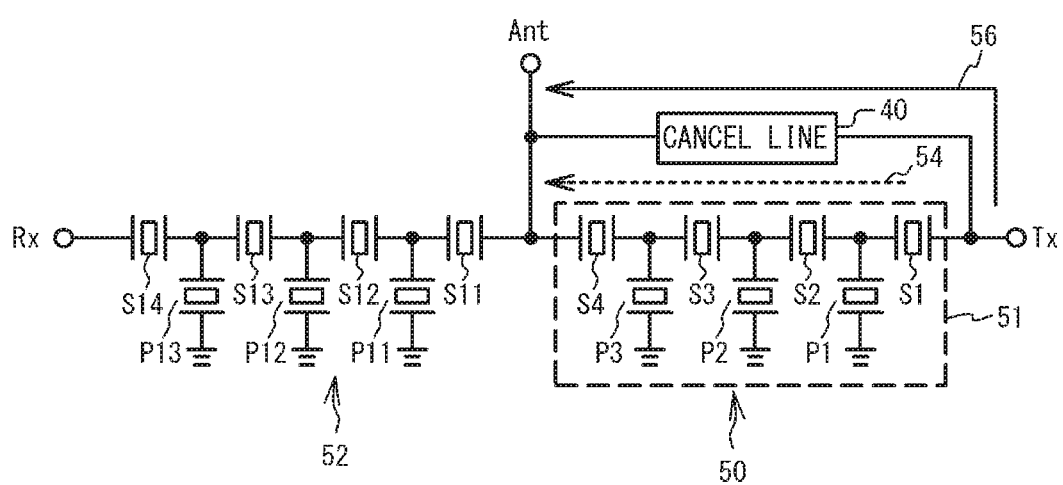
FIG. 1 is a circuit diagram of a duplexer in accordance with a first embodiment.

FIG. 1 is a circuit diagram of a duplexer in accordance with a first embodiment. As illustrated in FIG. 1, the duplexer includes a transmit filter 50 and a receive filter 52. The transmit filter 50 is connected between a common terminal Ant and a transmit terminal Tx. The receive filter 52 is connected between the common terminal Ant and a receive terminal Rx. The transmit filter 50 includes a ladder-type filter 51 and a cancel line 40. The ladder-type filter 51 includes series resonators S1 through S4 and parallel resonators P1 through P3. The series resonators S1 through S4 are connected in series between the transmit terminal Tx and the common terminal Ant. The parallel resonators P1 through P3 are connected in parallel between the transmit terminal Tx and the common terminal Ant. The cancel line 40 is connected in parallel to the ladder-type filter 51 between the transmit terminal Tx and the common terminal Ant.

The receive filter 52 includes series resonators S11 through S14 and parallel resonators P11 through P13. The series resonators S11 through S14 are connected in series between the common terminal Ant and the receive terminal Rx. The parallel resonators P11 through P13 are connected in parallel between the common terminal Ant and the receive terminal Rx.

The transmit filter 50 transmits signals in the transmit band to the common terminal Ant among signals input to the transmit terminal Tx, and suppresses other signals. The receive filter 52 transmits signals in the receive band to the receive terminal Rx among signals input to the common terminal Ant, and suppresses other signals. The passband of the transmit filter 50 and the passband of the receive filter 52 differ from each other, and do not overlap.

The ladder-type filter 51 suppresses signals in the receive band. However, some of signals 54 in the receive band pass through the ladder-type filter 51. The signal 54 deteriorates the attenuation characteristic of the transmit filter 50 in the receive band. When the signal 54 passes through the receive filter 52 and is output from the receive terminal Rx, the isolation characteristic from the transmit terminal Tx to the receive terminal Rx deteriorates.

Thus, the cancel line 40 generates signals 56 having a phase opposite to the phase of the signal 54 in the receive band and an amplitude approximately equal to the amplitude of the signal 54 in the receive band. The signal 56 cancels the signal 54 at the common terminal Ant. Thus, the attenuation characteristic and/or the isolation characteristic in the attenuation range is improved.

Figure 2:
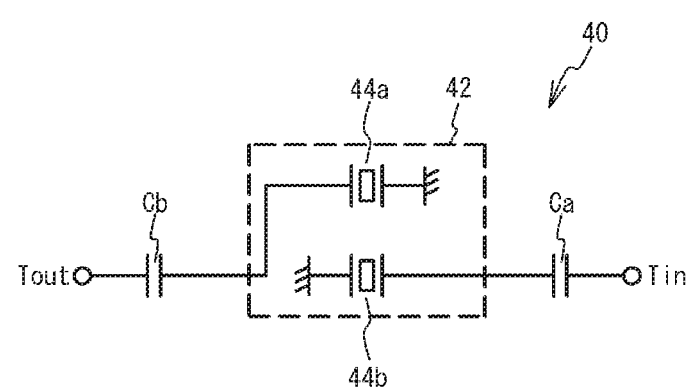
FIG. 2 is a circuit diagram of a cancel line in a first comparative example.

FIG. 2 is a circuit diagram of a cancel line in a first comparative example. As illustrated in FIG. 2, a capacitor Ca, a longitudinally coupled resonator 42, and a capacitor Cb are connected in series between an input terminal Tin and an output terminal Tout. The input terminal Tin and the output terminal Tout respectively correspond to the transmit terminal Tx and the common terminal Ant in FIG. 1. The capacitor Ca is connected between the input terminal Tin and the longitudinally coupled resonator 42. The capacitor Cb is connected between the longitudinally coupled resonator 42 and the output terminal Tout. The longitudinally coupled resonator 42 includes interdigital transducers (IDTs) 44a and 44b. The IDT 44a is connected between the capacitor Ca and a ground. The IDT 44b is connected between a ground and the capacitor Cb. The IDTs 44a and 44b are arranged in the propagation direction of the acoustic wave.

The longitudinally coupled resonator 42 adjusts the amplitude and the phase of the signal 56 by adjusting at least one of the distance between the IDTs 44a and 44b, the pitch between electrode fingers of the IDTs 44a and 44b, and the aperture length of the IDTs 44a and 44b. The capacitors Ca and Cb adjust the amplitude of the signal 56 by increasing the impedance of the cancel line 40.

Figure 3A:
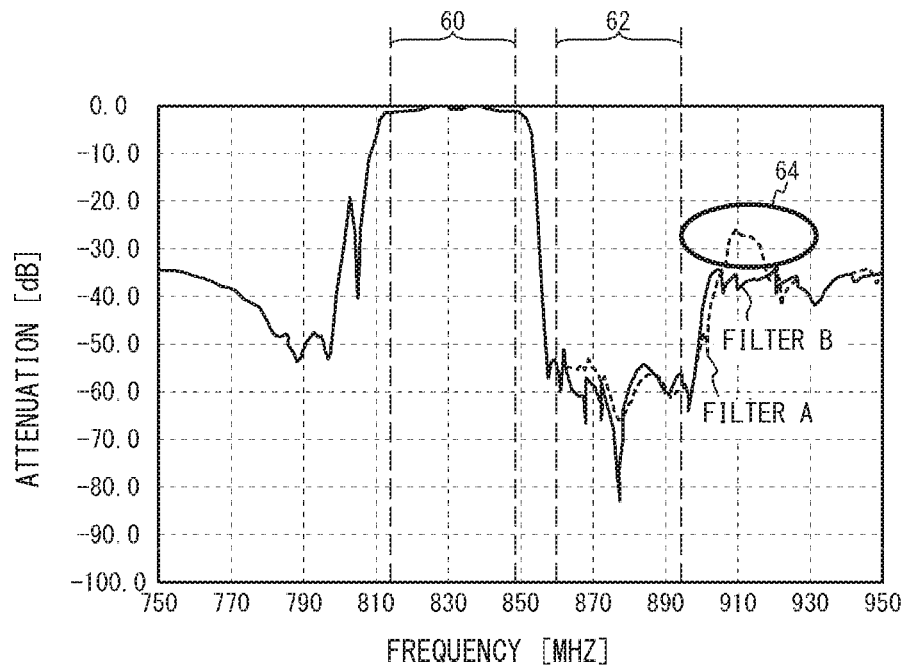
FIG. 3A illustrates transmission characteristics in filters A and B.
Figure 3B:
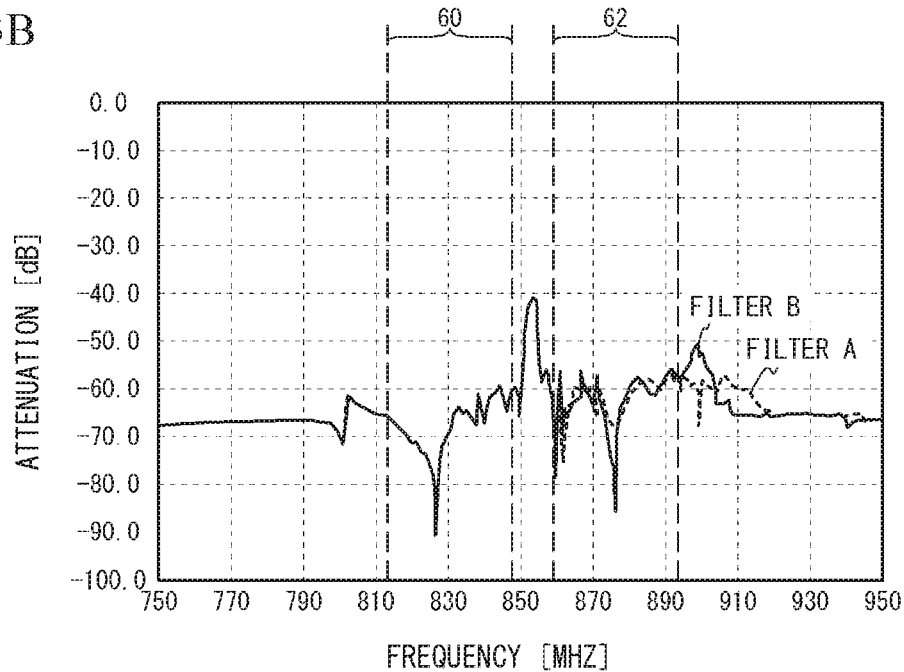
FIG. 3B illustrates isolation characteristics in the filters A and B.

FIG. 3A illustrates transmission characteristics in the filters A and B, and FIG. 3B illustrates isolation characteristics in the filters A and B. The details of the filter A and the filter B will be described later, but the filter A corresponds to the first comparative example of FIG. 2. The filter B corresponds to the first embodiment. The filters A and B were fabricated, and then the transmission characteristics and the isolation characteristics thereof were measured. As illustrated in FIG. 3A, in both the filters A and B, the passband corresponds to a transmit band 60, and the attenuation range corresponds to a receive band 62. As illustrated in FIG. 3B, the isolation characteristic in the receive band 62 is good in both the filters A and B. However, as illustrated in FIG. 3A, in the filter A (the first comparative example), an unnecessary response 64 is formed at frequencies higher than the receive band 62.

The reason why the unnecessary response 64 is generated is not clear, but is considered as follows, for example. To reduce the amplitude of the signal 56 in the receive band 62, the receive band 62 is configured to correspond to the attenuation range of the longitudinally coupled resonator 42. The longitudinally coupled resonator 42 has attenuation ranges at frequencies higher than the passband and frequencies lower than the passband. If the attenuation range of the longitudinally coupled resonator 42 at higher frequencies is configured to overlap with the receive band 62, the passband overlaps with the transmit band 60. Thus, the attenuation range of the longitudinally coupled resonator 42 at lower frequencies is configured to overlap with the receive band 62. This configuration generates the unnecessary response due to the passband at frequencies higher than the receive band 62.

Figure 4A:
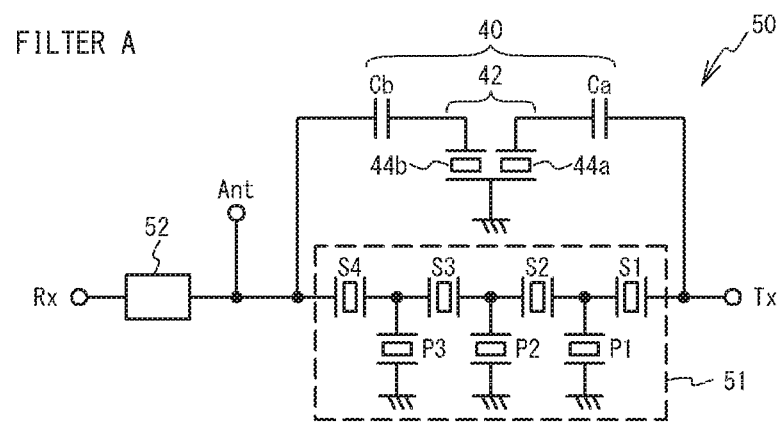
FIG. 4A is a circuit diagram of a duplexer including the filter A.
Figure 4B:
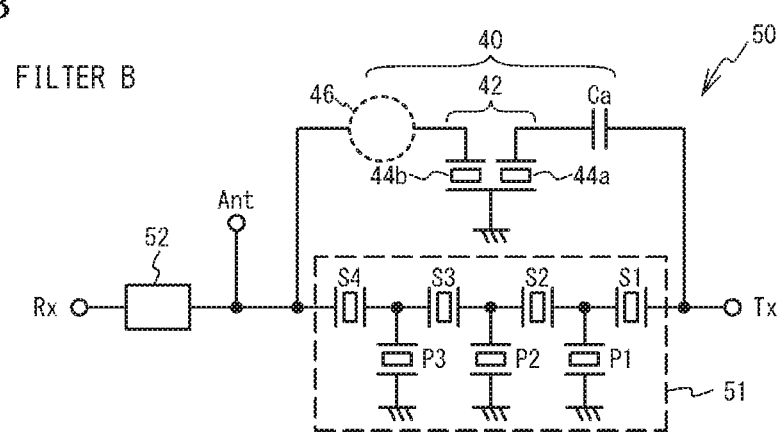
FIG. 4B is a circuit diagram of a duplexer including the filter B.

To reduce the unnecessary response 64, examined were the filters A through D. FIG. 4A through FIG. 5B are circuit diagrams of duplexers including the filters A through D, respectively. As illustrated in FIG. 4A, the filter A is the transmit filter 50 of the duplexer. The cancel line 40 is the same as that of the first comparative example illustrated in FIG. 2. Other structures are the same as those of FIG. 1, and the description thereof is thus omitted. As illustrated in FIG. 4B, in the filter B, the cancel line 40 includes no capacitor Cb but a separation part 46 having no wiring line formed therein. Other structures are the same as those of the filter A, and the description thereof is thus omitted.

Figure 5A:
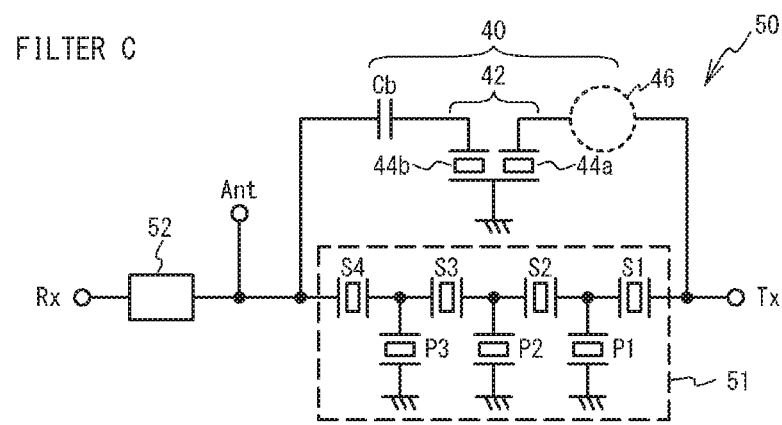
FIG. 5A is a circuit diagram of a duplexer including a filter C.
Figure 5B:
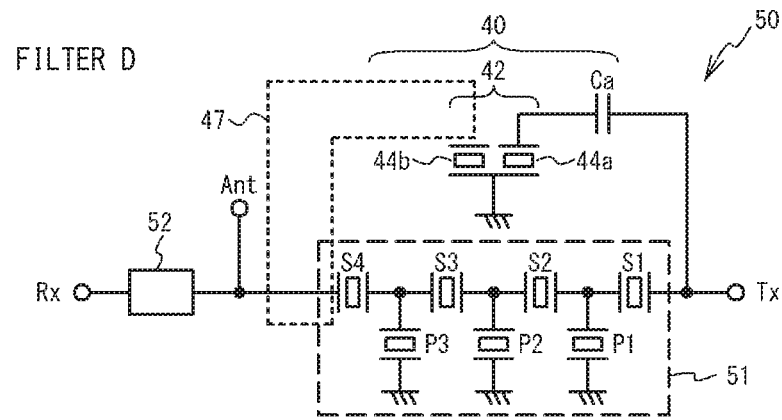
FIG. 5B is a circuit diagram of a duplexer including a filter D.

As illustrated in FIG. 5A, in the filter C, the cancel line 40 includes no capacitor Ca but the separation part 46 having no wiring line formed therein. Other structures are the same as those of the filter A, and the description thereof is thus omitted. As illustrated in FIG. 5B, in the filter D, located is a region 47 having neither a wiring line nor the capacitor Cb formed between the longitudinally coupled resonator 42 and the common terminal Ant. Other structures are the same as those of the filter A, and the description thereof is thus omitted.

Figure 6:
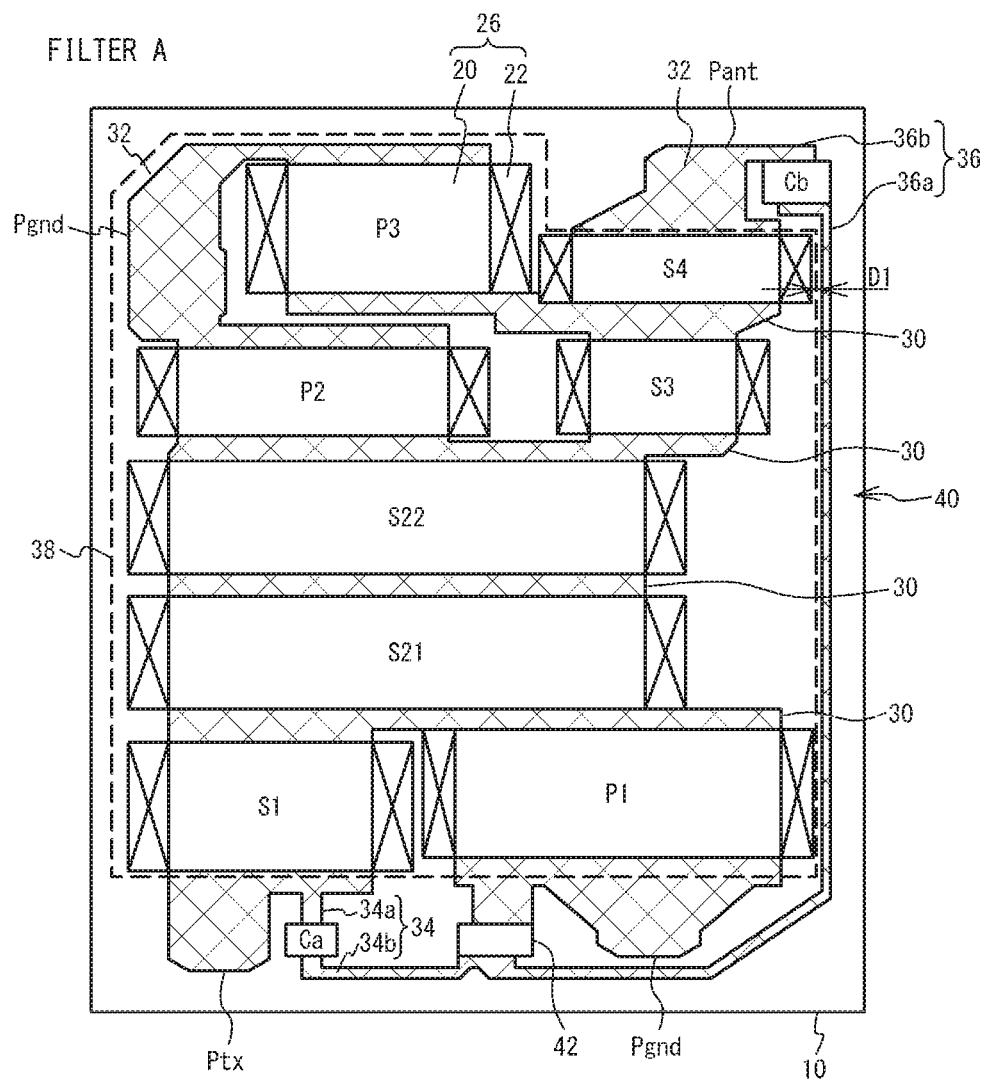
FIG. 6 is a plan view of a piezoelectric substrate including the filter A formed thereon.

FIG. 6 through FIG. 9 are plan views of piezoelectric substrates including the filters A through D formed thereon, respectively. As illustrated in FIG. 6, in the filter A, acoustic wave resonators 26, wiring lines 30, pads 32, and the cancel line 40 are located on a piezoelectric substrate 10. The acoustic wave resonator 26 includes an IDT 20 and reflectors 22. The acoustic wave resonators 26 include the series resonators S1 through S4 and the parallel resonators P1 through P3. The series resonator S2 is serially divided into series resonators S21 and S22. The wiring lines 30 electrically connect between the acoustic wave resonators 26. The pads 32 are pads for providing connection with an external circuit, and bumps or bonding wires are coupled to the pads 32. The pads 32 include a transmit pad Ptx, a common pad Pant, and ground pads Pgnd. The transmit pad Ptx is electrically connected to the transmit terminal Tx via a bump and the like. The common pad Pant is electrically connected to the common terminal Ant via a bump or the like. The ground pad Pgnd is electrically connected to a ground via a bump or the like.

The cancel line 40 includes the longitudinally coupled resonator 42, the capacitors Ca and Cb, and wiring lines 34 and 36. The wiring line 34 includes a wiring line 34a, which connects the transmit pad Ptx to the capacitor Ca, and a wiring line 34b, which connects the capacitor Ca to the longitudinally coupled resonator 42. The wiring line 36 includes a wiring line 36a, which connects the longitudinally coupled resonator 42 to the capacitor Cb, and a wiring line 36b, which connects the capacitor Cb to the common pad Pant.

The series resonators S1 through S4 and the parallel resonators P1 through P3 are located in a region 38 that is sandwiched between the transmit pad Ptx and the common pad Pant and is located on the piezoelectric substrate 10. The capacitor Ca and the longitudinally coupled resonator 42 are located at the side at which the transmit pad Ptx is located with respect to the region 38. The capacitor Cb is located at the side at which the common pad Pant is located with respect to a region including the series resonators S1 through S4 formed therein. Thus, the wiring line 36a is adjacent to the region 38 and extends from the transmit pad Ptx side to the common pad Pant side. A distance between the wiring line 36a and the resonator most adjacent to the wiring line 36a among the series resonators S1 through S4 and the parallel resonators P1 through P3 is represented by D1. In FIG. 6, the series resonator S4 is most adjacent to the wiring line 36a.

Figure 7:
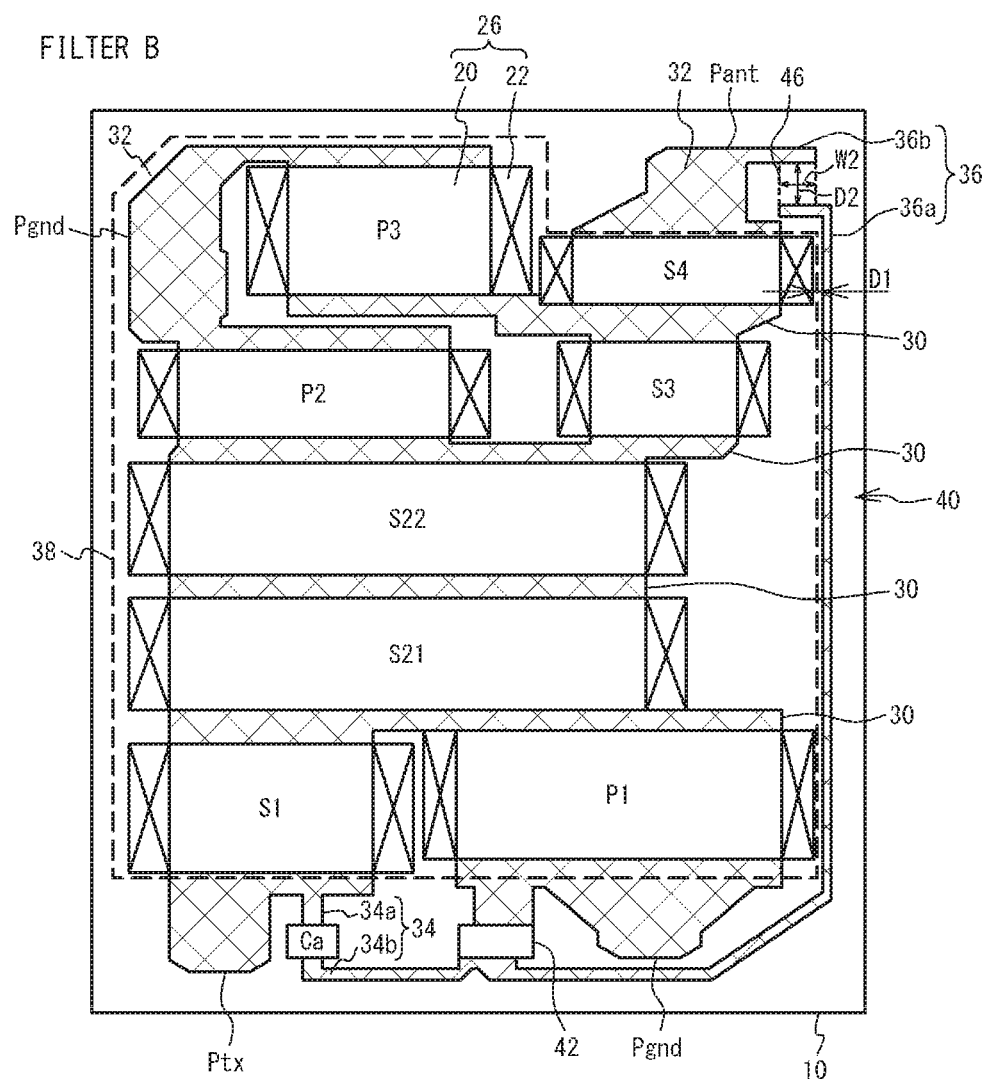
FIG. 7 is a plan view of a piezoelectric substrate including the filter B formed thereon.

As illustrated in FIG. 7, in the filter B, no capacitor Cb is provided. In the separation part 46, the width along which the wiring lines 36a and 36b face each other is represented by W2, and the distance between the wiring lines 36a and 36b is represented by D2. Other structures are the same as those of the filter A, and the description thereof is thus omitted.

Figure 8:
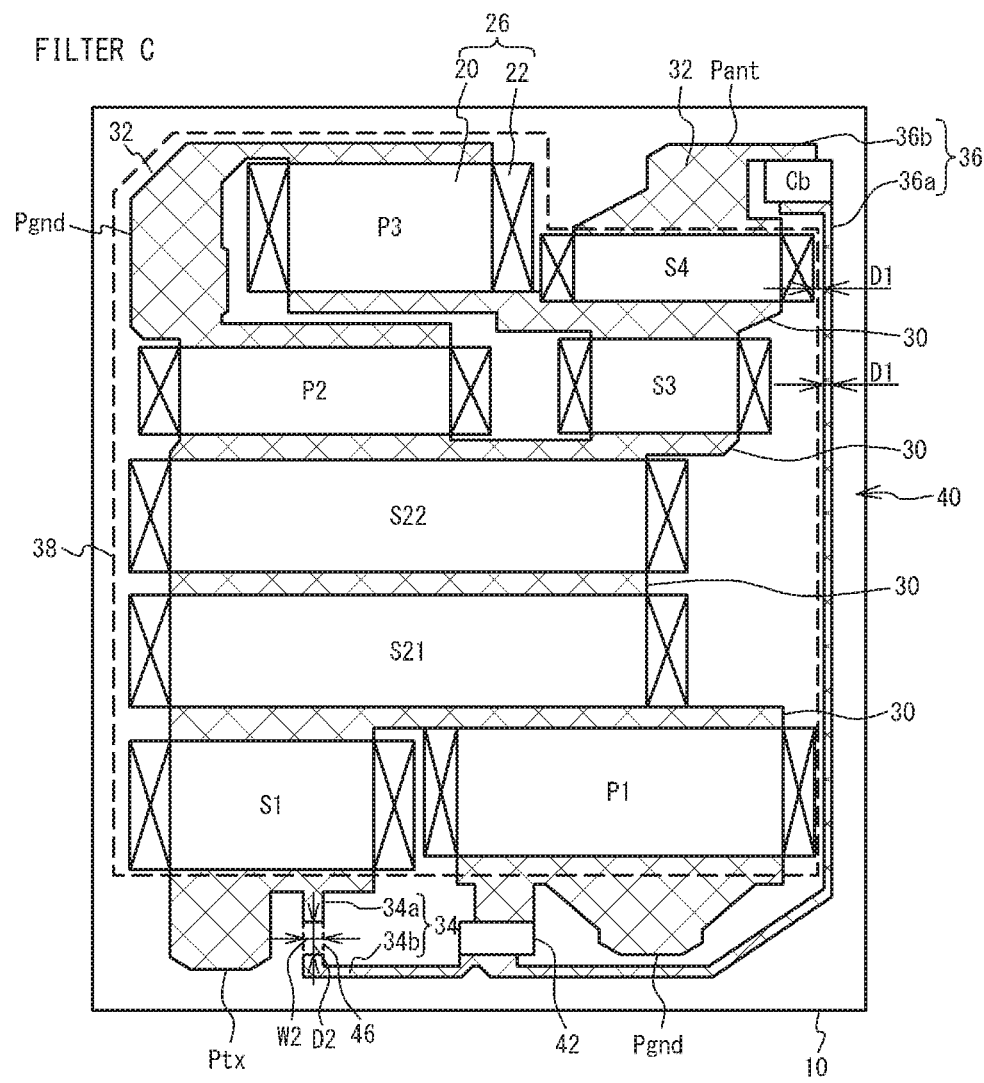
FIG. 8 is a plan view of a piezoelectric substrate including the filter C formed thereon.

As illustrated in FIG. 8, in the filter C, no capacitor Ca is provided. In the separation part 46, the width along which the wiring lines 34a and 34b face each other is represented by W2, and the distance between the wiring lines 34a and 34b is represented by D2. Other structures are the same as those of the filter A, and the description thereof is thus omitted.

Figure 9:
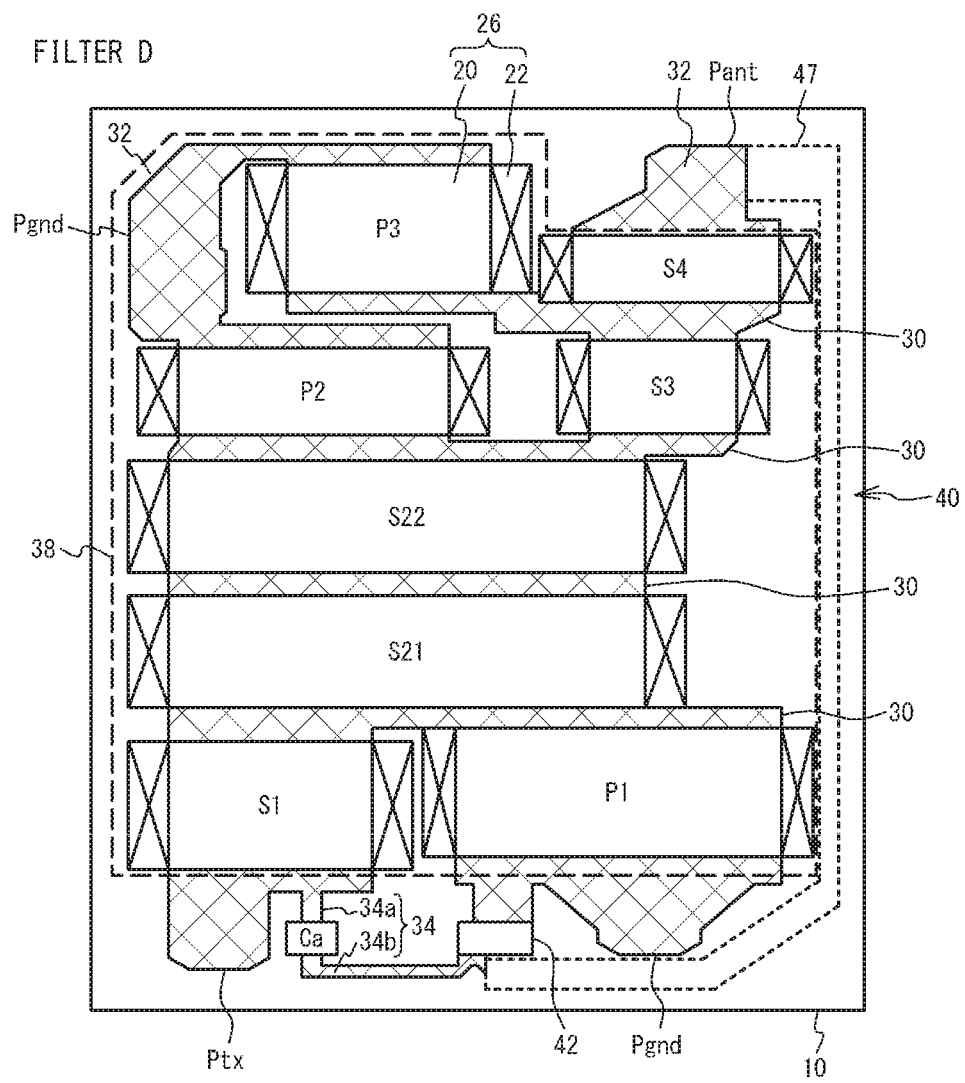
FIG. 9 is a plan view of a piezoelectric substrate including the filter D formed thereon.

As illustrated in FIG. 9, in the filter D, no capacitor Cb and no wiring line 36 are provided, forming the region 47. Other structures are the same as those of the filter A, and the description thereof is thus omitted.

Figure 10A:
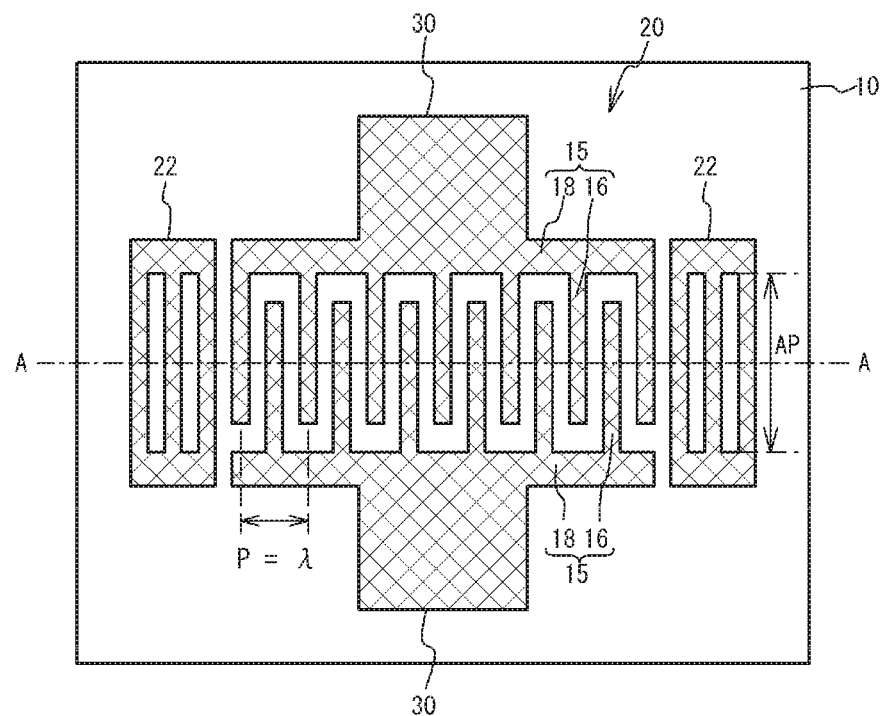
FIG. 10A is a plan view of a one-port acoustic wave resonator in the filters A through D.
Figure 10B:
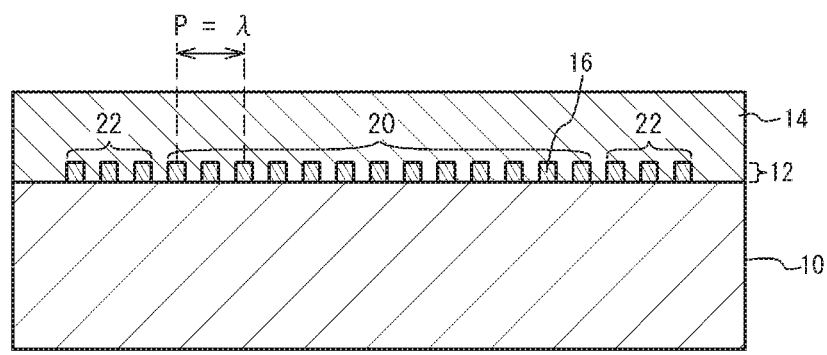
FIG. 10B is a cross-sectional view taken along line A-A in FIG. 10A.

FIG. 10A is a plan view of a one-port acoustic wave resonator in the filters A through D, and FIG. 10B is a cross-sectional view taken along line A-A in FIG. 10A. As illustrated in FIG. 10A and FIG. 10B, the IDT 20 and the reflectors 22 are located on the piezoelectric substrate 10. The IDT 20 and the reflectors 22 are formed of a metal film 12 formed on the piezoelectric substrate 10. The IDT 20 includes a pair of comb-shaped electrodes 15 facing each other. The comb-shaped electrode 15 includes electrode fingers 16 and a bus bar 18 to which the electrode fingers 16 are coupled. The pair of comb-shaped electrodes 15 are arranged so as to face each other so that the electrode fingers 16 of one of the comb-shaped electrodes 15 and the electrode fingers 16 of the other are alternately arranged. The wiring line 30 is connected to the bus bar 18. A temperature compensation film 14 is located on the piezoelectric substrate 10 so as to cover the metal film 12.

The acoustic wave excited by the electrode fingers 16 mainly propagates in the arrangement direction of the electrode fingers 16. The propagating acoustic wave is reflected by the reflectors 22. The pitch P of the electrode fingers 16 corresponds to approximately the wavelength $\lambda$ of the acoustic wave. The propagation direction of the acoustic wave is defined as an X direction, and the direction perpendicular to the propagation direction (i.e., the extension direction of the electrode fingers 16) is defined as a Y direction. The X direction and the Y direction do not necessarily correspond to the X-axis orientation and the Y-axis orientation of the crystal orientation of the piezoelectric substrate 10, respectively. The length along which the electrode fingers 16 overlap in the Y direction is an aperture length AP. When the piezoelectric substrate 10 is a rotated Y-cut X-propagation lithium tantalate substrate or a lithium niobate substrate, the X direction corresponds to the X-axis orientation of the crystal orientation. The piezoelectric substrate 10 may be bonded on an insulating substrate such as a sapphire substrate, a spinel substrate, or an alumina substrate, or a semiconductor substrate such as a silicon substrate. Instead of the temperature compensation film 14, a protective film thinner than the metal film 12 may be provided. The metal film 12 is, for example, an aluminum film or a copper film.

Figure 11:
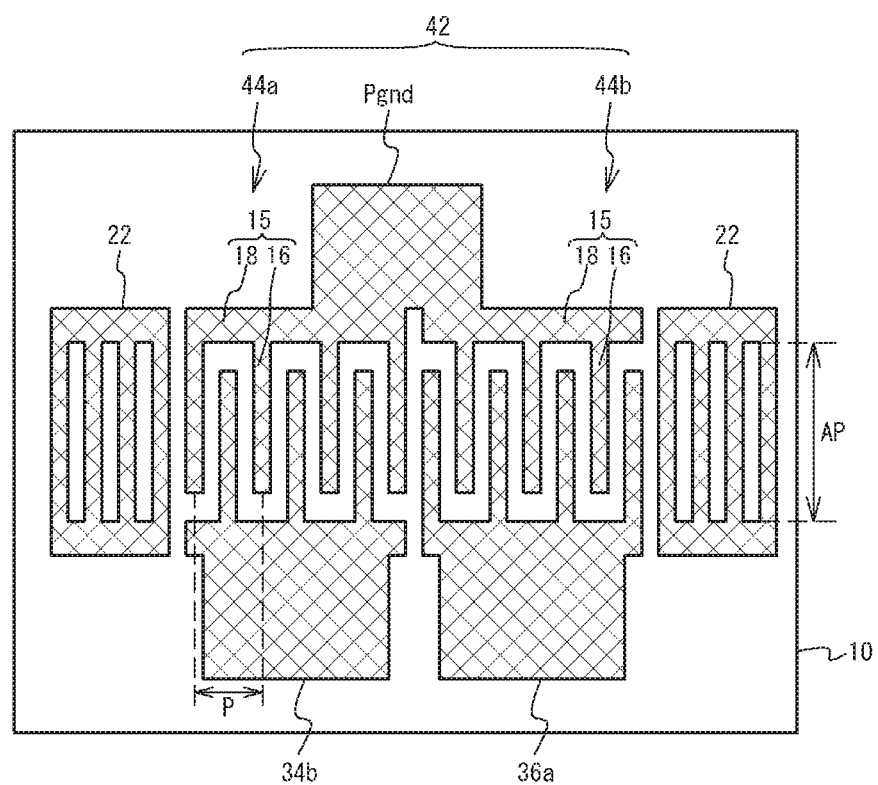
FIG. 11 is a plan view of a longitudinally coupled resonator in the filters A through D.

FIG. 11 is a plan view of the longitudinally coupled resonator in the filters A through D. As illustrated in FIG. 11, in the longitudinally coupled resonator 42, the IDTs 44a and 44b are located between the reflectors 22. The IDT 44a is connected between the wiring line 34b and the ground pad Pgnd. The IDT 44b is connected between the wiring line 36a and the ground pad Pgnd. Other structures are the same as those of the one-port acoustic wave resonator, and the description thereof is thus omitted.

Figure 12:
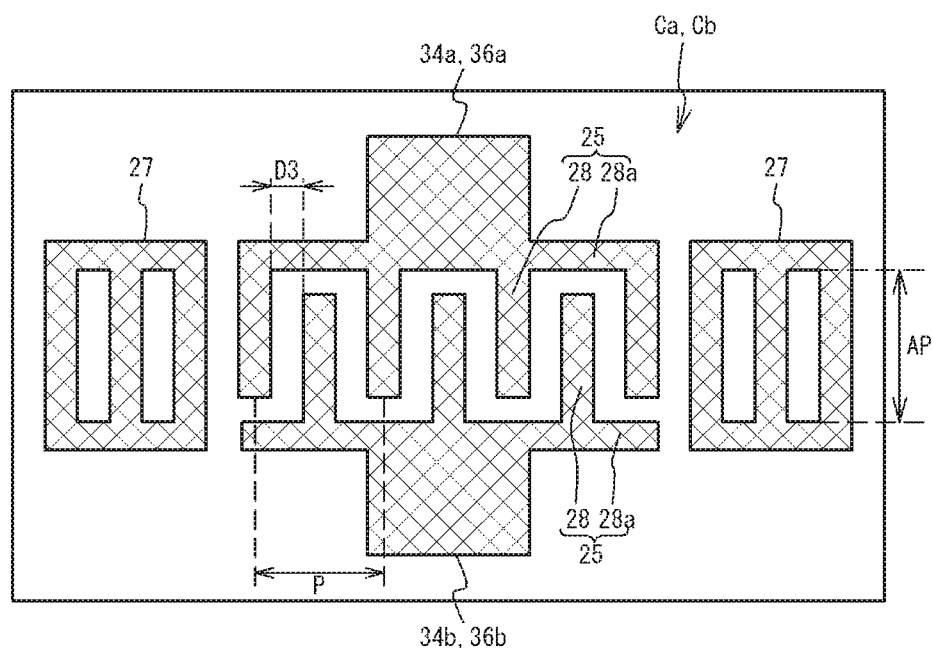
FIG. 12 is a plan view of a capacitor in the filters A through D.

FIG. 12 is a plan view of a capacitor in the filters A through D. As illustrated in FIG. 12, each of the capacitors Ca and Cb includes a pair of comb-shaped electrodes 25 each including electrode fingers 28 and a bus bar 28a. Reflectors 27 are located at both sides of the comb-shaped electrodes 25. The pair of comb-shaped electrodes 25 face each other in a planar direction so that the electrode fingers 28 of one of the comb-shaped electrodes 25 and the electrode fingers 28 of the other of the comb-shaped electrodes 25 are substantially alternately arranged. One of the comb-shaped electrodes 25 is coupled to the wiring line 34a or 36a, and the other of the comb-shaped electrodes 25 is coupled to the wiring line 34b or 36b. The distance between the adjacent electrode fingers 28 is represented by D3. The pitch P of the electrode fingers 28 differs from the pitch of the electrode fingers 16 of the IDT 20. The presence of the reflectors 27 and the difference in the pitch P inhibit the acoustic wave excited by the comb-shaped electrodes 25 from interfering with the acoustic wave resonator 26. Other structures are the same as those of the one-port acoustic wave resonator, and the description thereof is thus omitted.

The transmission characteristics and the isolation characteristics of the duplexers using the filters A and B as a transmit filter were measured. The passbands and the isolation characteristics of the duplexers using the filters C and D as a transmit filter were simulated. The measurement conditions and the simulation conditions are as follows.

Filter: Band 26 (transmit band: 814 MHz-849 MHz, receive band: 859 MHz-894 MHz) of Evolved Universal Terrestrial Radio Access (E-UTRA) Operating Band Piezoelectric substrate 10: 128° rotated Y-cut X-propagation lithium niobate substrate with a film thickness of 250 μm Metal film 12: Copper film with a film thickness of 240 nm Temperature compensation film 14: Silicon oxide film with a film thickness of 950 nm FIG. 13 presents dimensions and the like of the cancel line in each of the filters A and B. As presented in FIG. 13, the pitch P, the number of pairs in the IDT, the number of pairs in the reflector, the aperture length AP, the duty ratio in the IDT, the duty ratio in the reflector, D3, and the capacitance of each of the capacitors Ca and Cb and the longitudinally coupled resonator 42 (DMS) were determined. D1, D2, and W2 in the cancel line 40 were also determined. Each value is the optimized value in each of the filters A through D. Since the longitudinally coupled resonator 42 includes a plurality of IDTs, the minimum number and the maximum number are presented as the number of pairs in the IDT. In the filters C and D, the cancel lines 40 were arranged as illustrated in FIG. 8 and FIG. 9, respectively, and other structures were configured to be the same as those of the filter B.

Figure 14A:
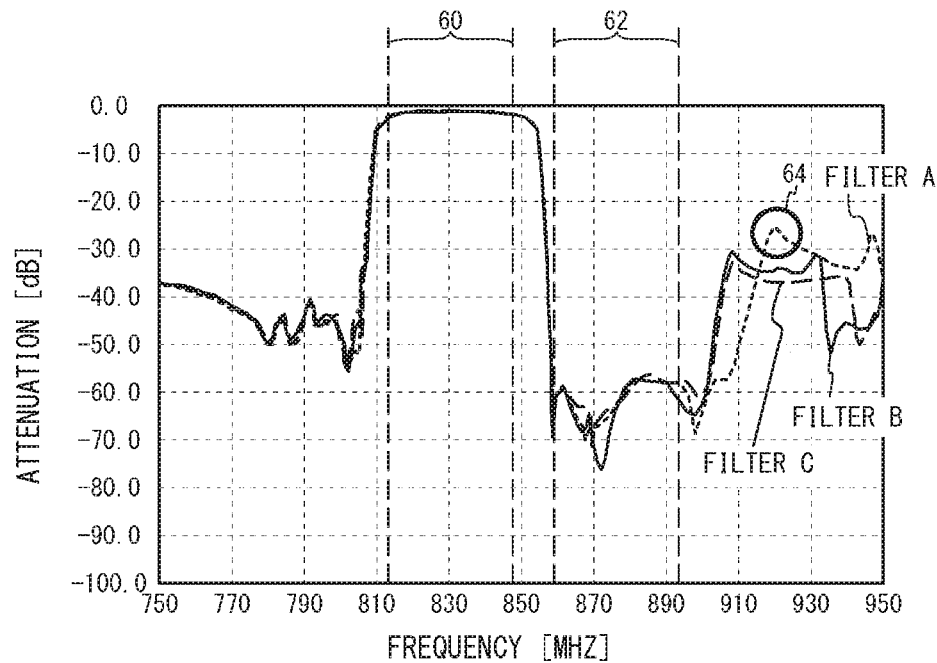
FIG. 14A illustrates transmission characteristics in the filters A through C.
Figure 14B:
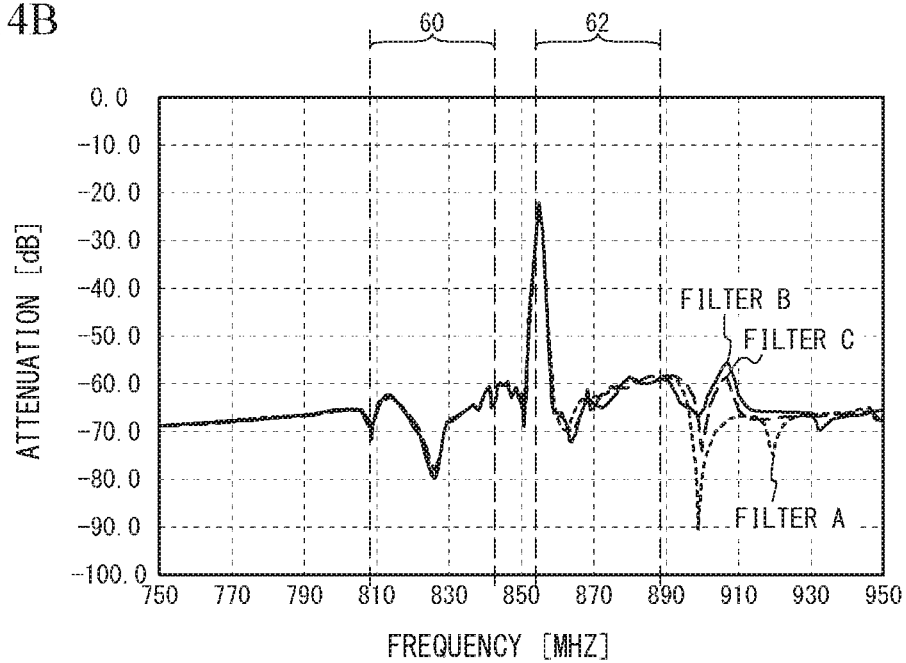
FIG. 14B illustrates isolation characteristics in the filters A through C.

FIG. 14A and FIG. 14B illustrate transmission characteristics and isolation characteristics in the filters A through C. As illustrated in FIG. 14A, in the filter A, the unnecessary response 64 is generated at frequencies from 910 MHz to 930 MHz. In the filters B and C, the unnecessary response 64 at frequencies from 910 MHz to 930 MHz is reduced. As illustrated in FIG. 14B, the isolation characteristic in the receive band 62 is approximately the same among the filters A through C. As described above, the filters B and C have isolation characteristics that are approximately the same as that of the filter A, and are able to reduce the unnecessary response 64.

Figure 15A:
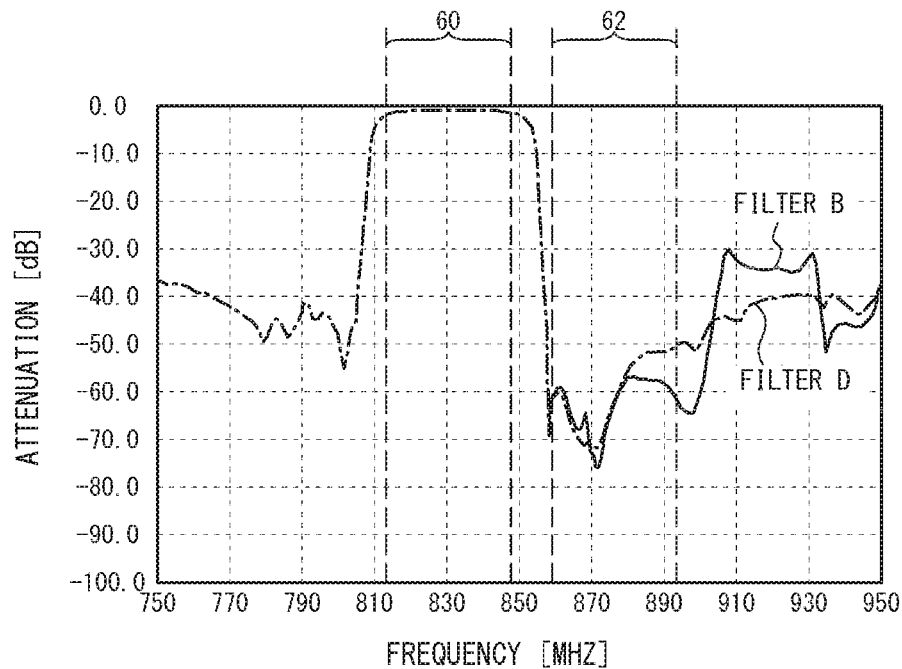
FIG. 15A illustrates transmission characteristics in the filters B and D.
Figure 15B:
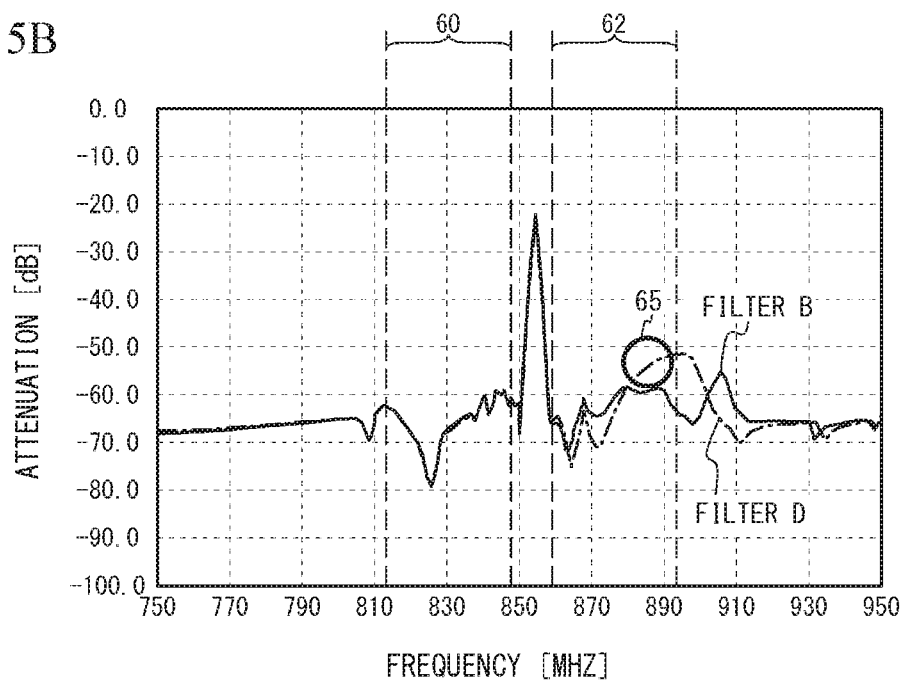
FIG. 15B illustrates isolation characteristics in the filters B and D.

FIG. 15A and FIG. 15B illustrate transmission characteristics and isolation characteristics in the filters B and D. As illustrated in FIG. 15A, the filter D has a better attenuation characteristic than the filter B at frequencies from 910 MHz to 930 MHz. As illustrated in FIG. 15B, in the filter D, the isolation characteristic in the receive band 62 deteriorates more than that in the filter B (see a solid circle 65). As described above, in the filter D, the cancel line 40 fails to generate the signal 56 that cancels the signal 54, and fails to function as the cancel line.

Figure 16:
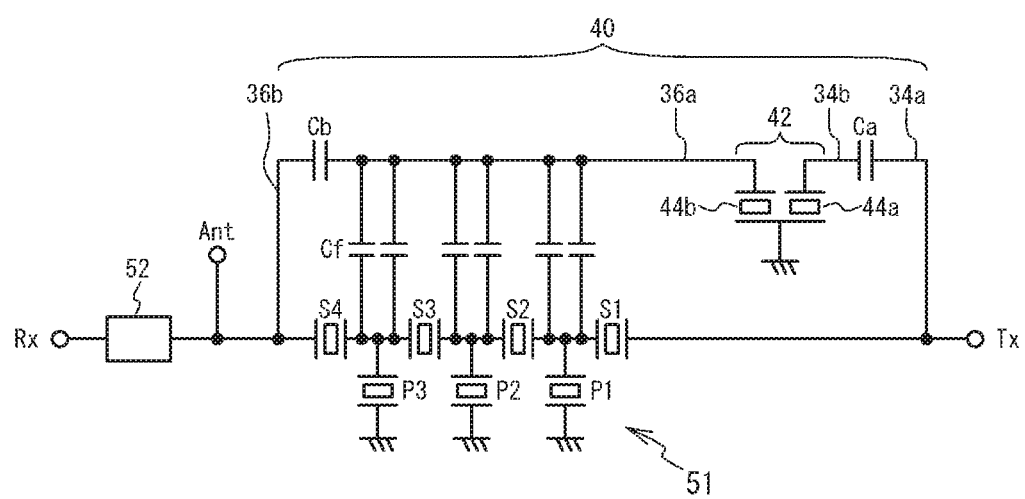
FIG. 16 is a schematic circuit diagram of the filter A.

The reason why the unnecessary response 64 is reduced in the filters B and C is not clear, but is considered as follows. FIG. 16 is a schematic circuit diagram of the filter A. As illustrated in FIG. 16, in the filter A, as illustrated in FIG. 6, the wiring line 36a is adjacent to the ladder-type filter 51, and parasitic capacitances Cf are thus added. In the example of FIG. 6, the largest parasitic capacitance Cf is added between the series resonator S4 and the wiring line 36a.

In the filter A, the amplitude of the signal 56 (see FIG. 1) through the longitudinally coupled resonator 42 is large, and the passband of the longitudinally coupled resonator 42 forms the unnecessary response 64. In the filters B and C, neither the capacitor Ca nor Cb is provided, but the separation part 46 is provided. Thus, the impedance of the separation part 46 is large. Accordingly, the amplitude of the signal 56 passing through the longitudinally coupled resonator 42 becomes small, and the unnecessary response 64 is reduced. When the amplitude of the signal 56 in the receive band 62 becomes smaller than that of the signal 54 by provision of the separation part 46, the cancel line 40 becomes fail to function as the cancel line. However, the signal 56 in the receive band 62 flows through the parasitic capacitance Cf. Accordingly, the amplitudes of the signals 56 and 54 in the receive band 62 are made to be approximately the same. Additionally, the longitudinally coupled resonator 42 causes the signals 56 and 54 in the receive band 62 to have approximately opposite phases. In the filter D, since the parasitic capacitance Cf is very small, the amplitude of the signal 56 in the receive band 62 is smaller than that of the signal 54. Thus, the cancel line 40 fails to function as a cancel line.

The best connection in the filters B and C was examined by simulation. The capacitor and the separation part located in the wiring lines 34 and 36 in each filter are as follows.

Filter A: The wiring line 34 includes the capacitor Ca but no separation part 46 while the wiring line 36 includes the capacitor Cb but no separation part 46.
Filter B: The wiring line 34 includes the capacitor Ca but no separation part 46 while the wiring line 36 includes no capacitor Cb but the separation part 46.
Filter C: The wiring line 34 includes no capacitor Ca but the separation part 46 while the wiring line 36 includes the capacitor Cb but no separation part 46.
Filter B': The wiring line 34 includes neither the capacitor Ca nor the separation part 46 and the wiring lines 34a and 34b are short circuited while the wiring line 36 includes no capacitor Cb but the separation part 46.
Filter C': The wiring line 34 includes no capacitor Ca but the separation part 46 while the wiring line 36 includes neither the capacitor Cb nor the separation part 46 and the wiring lines 36a and 36b are short circuited.
Filter E: no cancel line 40 is provided.

The extension direction of the electrode fingers of the capacitors Ca and Cb is rotated by 90° with respect to the extension direction of the electrode fingers of the acoustic wave resonator 26. This configuration further reduces the interference between the capacitors Ca and Cb and the acoustic wave resonator 26. The simulation condition corresponding to FIG. 13 is optimized.

Figure 17A:
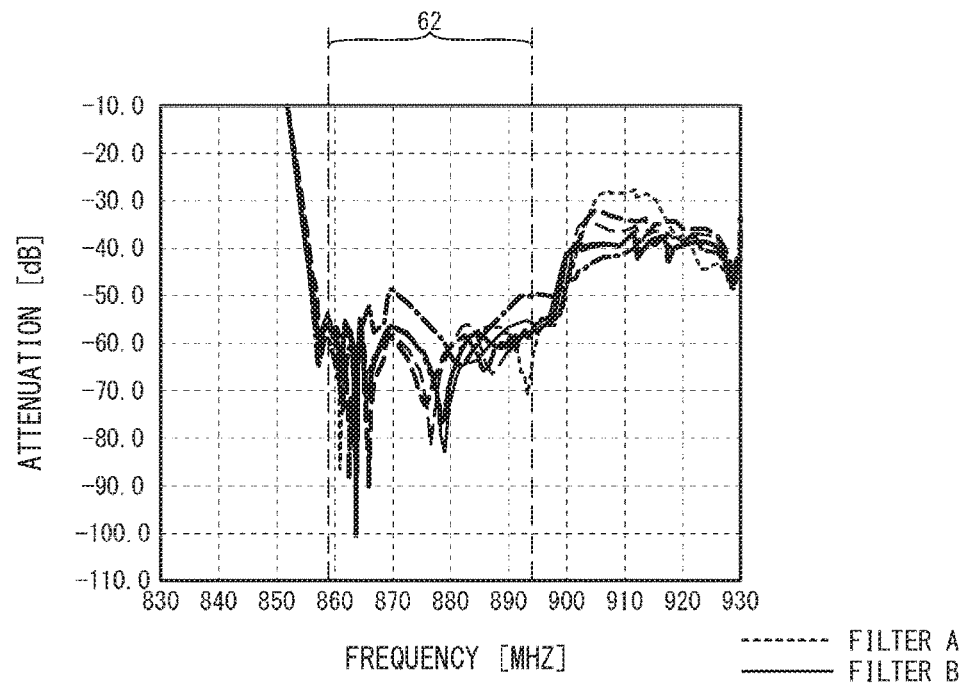
FIG. 17A illustrates transmission characteristics in individual filters.
Figure 17B:
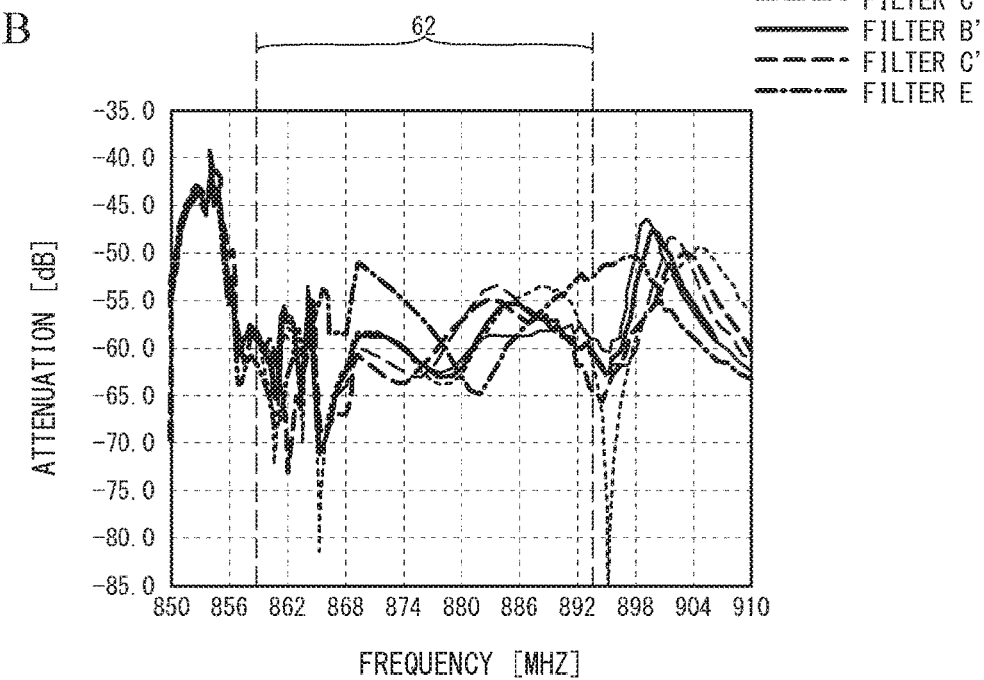
FIG. 17B illustrates isolation characteristics in individual filters.

FIG. 17A illustrates transmission characteristics in individual filters, and FIG. 17B illustrates isolation characteristics in individual filters. As illustrated in FIG. 17A, the attenuation characteristic in the frequency range from 900 MHz to 920 MHz is worst in the filter A, and becomes better in the order of the filters C', C, B', B, and E. As illustrated in FIG. 17B, the isolation characteristic in the receive band 62 is bad in the filter E. The isolation characteristics in the receive band 62 of the filters A, B, C, B', and C' are approximately the same, and better than that of the filter E.

As described above, since the filter E has no cancel line 40, the isolation characteristic thereof is bad. The comparison between the filters B and C and the comparison between the filters B' and C' reveal that it is better to replace the capacitor Cb by the separation part 46 than to replace the capacitor Ca by the separation part 46. The reason is considered to be because the parasitic capacitance Cf functions as the capacitor Cb. That is, when the longitudinally coupled resonator 42 is located at a side at which the common terminal Ant is located, and the wiring line 34b is adjacent to the series resonator, the separation part 46 is preferably provided instead of the capacitor Ca.

The comparison between the filters B and B' and the comparison between the filters C and C' reveal that the capacitor Ca (or Cb), which is not replaced by the separation part 46, may be omitted, and the wiring lines 34a and 34b (or the wiring lines 36a and 36b) may be short circuited. When no capacitor Ca is provided, the amplitude of the signal 56 is to be adjusted by the longitudinally coupled resonator 42 and the distance D1. Thus, to adjust the amplitude of the signal 56, the capacitor Ca or Cb is preferably provided.

Figure 18A:
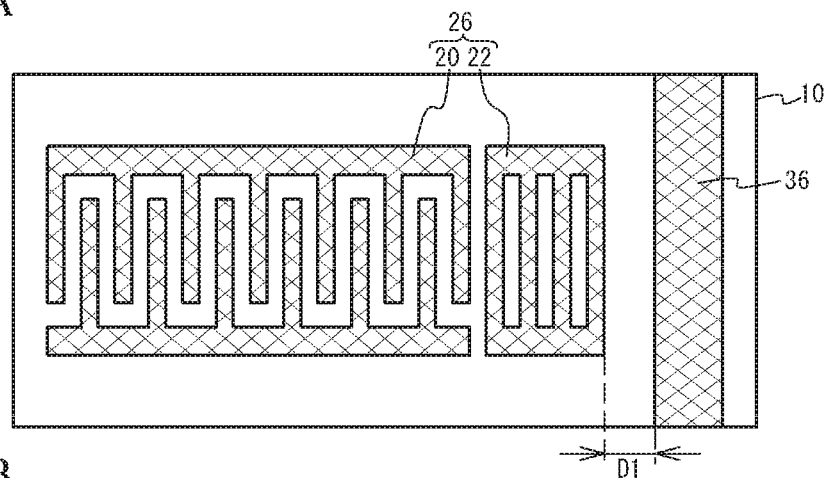
FIG. 18A through FIG. 18C illustrate a distance D1 in the first embodiment.
Figure 18B:
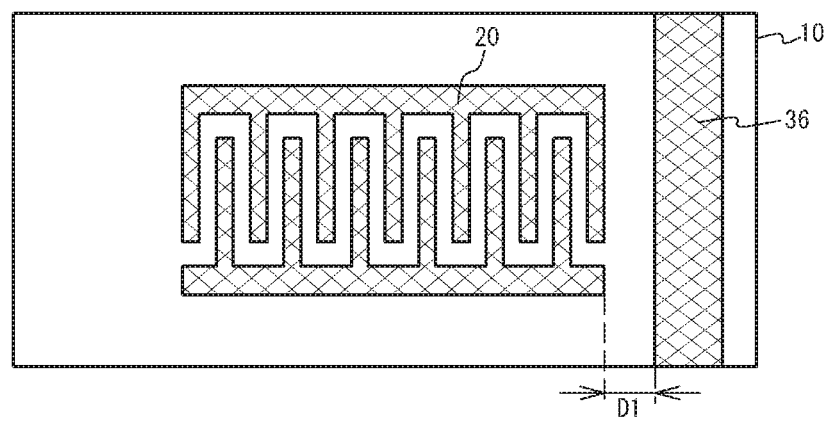
Figure 18C:
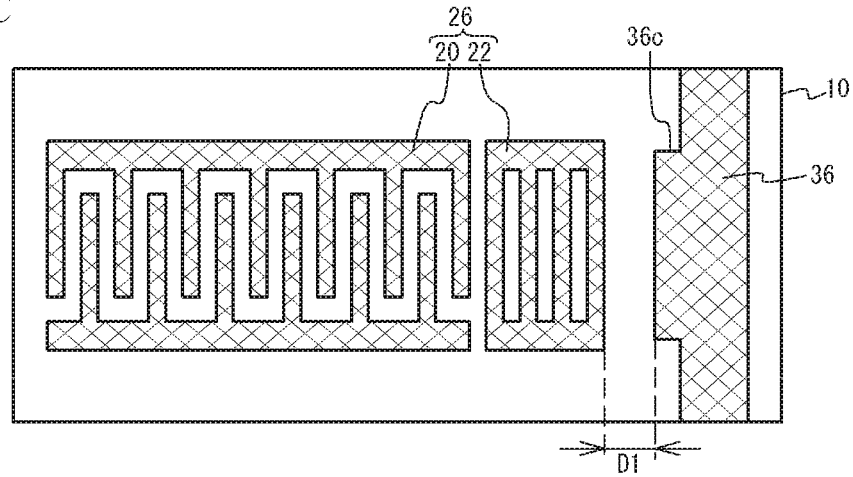

FIG. 18A through FIG. 18C illustrate the distance D1 in the first embodiment. As illustrated in FIG. 18A, the reflector 22 of the acoustic wave resonator 26 is adjacent to the wiring line 36. In this structure, the distance D1 is the distance between the reflector 22 and the wiring line 36. As illustrated in FIG. 18B, the acoustic wave resonator 26 includes no reflector 22. In this structure, the distance D1 is the distance between the IDT 20 and the wiring line 36. As illustrated in FIG. 18C, the wiring line 36 includes a protrusion portion 36c in a planar direction. In this structure, the distance D1 is the distance between the protrusion portion 36c and the reflector 22.

Variations of the First Embodiment

Figure 19:
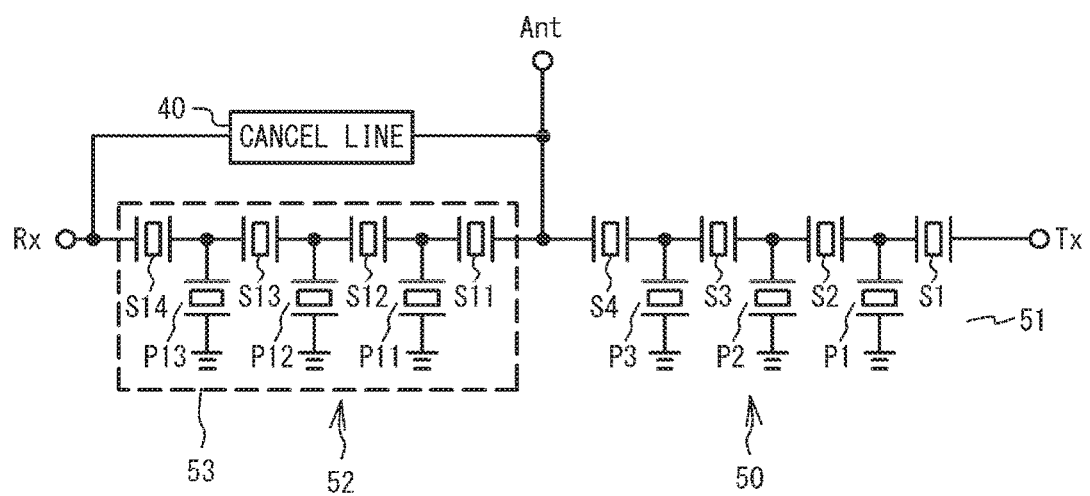
FIG. 19 is a circuit diagram of a duplexer in accordance with a first variation of the first embodiment.

FIG. 19 is a circuit diagram of a duplexer in accordance with a first variation of the first embodiment. As illustrated in FIG. 19, the cancel line 40 may be connected in parallel to a ladder-type filter 53 between the receive terminal Rx and the common terminal Ant. Other structures are the same as those of the first embodiment, and the description thereof is thus omitted. The cancel line 40 may be connected between the transmit terminal Tx and the receive terminal Rx.

Figure 20A:
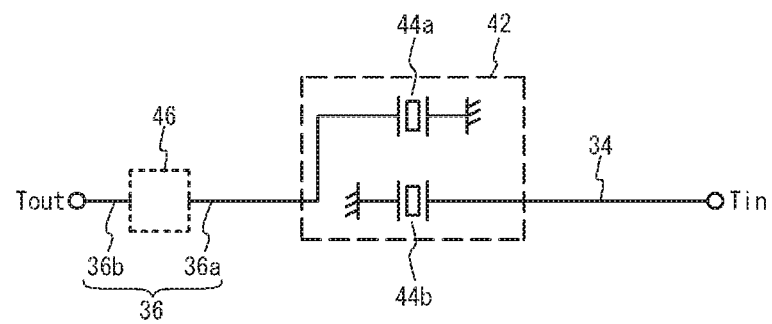
FIG. 20A through FIG. 20C are circuit diagrams of cancel lines in second through fourth variations of the first embodiment, respectively.
Figure 20B:
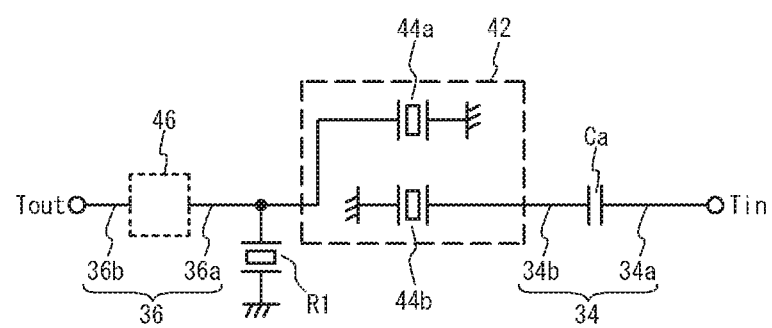
Figure 20C:
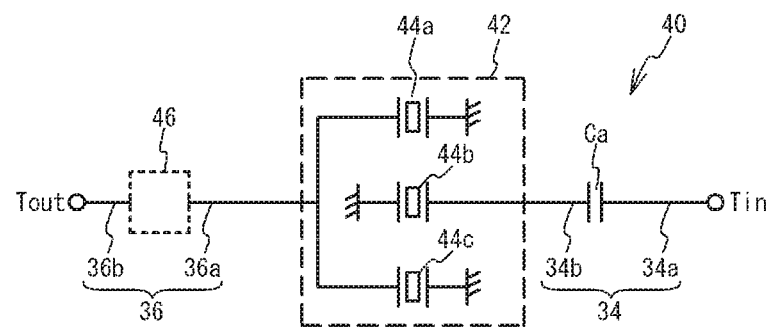

FIG. 20A through FIG. 20C are circuit diagrams of the cancel lines in second through fourth variations of the first embodiment. As illustrated in FIG. 20A, the wiring line 34 may include neither the capacitor Ca nor the separation part 46. A resistor or the like may be connected in series with the wiring line 34. As illustrated in FIG. 20B, a one-port acoustic wave resonator R1 may be connected between the wiring line 36a and a ground. As illustrated in FIG. 20C, the longitudinally coupled resonator 42 may include three IDTs 44a through 44c. The number of IDTs included in the longitudinally coupled resonator 42 may be four or more.

In the first embodiment and the variations thereof, as illustrated in FIG. 7 and FIG. 8, one or more series resonators S1 through S4 are located in the region 38 and are electrically connected in series between the transmit pad Ptx (an input pad) and the common pad Pant (an output pad). One or more parallel resonators P1 through P3 are located in the region 38 and are electrically connected in parallel between the transmit pad Ptx and the common pad Pant. The longitudinally coupled resonator 42 (a longitudinally coupled acoustic wave resonator) is located at the side at which the transmit pad Ptx is located with respect to the region 38. The wiring line 34 (a first wiring line) connects the transmit pad Ptx to the longitudinally coupled resonator 42. The wiring line 36 (a second wiring line) connects the common pad Pant to the longitudinally coupled resonator 42. The separation part 46 is located in the wiring line 34 or 36 (one of the first wiring line and the second wiring line). In the separation part 46, the wiring lines 36a and 36b (or the wiring lines 34a and 34b) are separated in a planar direction by the distance D2, which is greater than the distance D1 between the wiring line 36 and the resonator most adjacent to the wiring line 36 among the series resonators and the parallel resonators. This structure reduces the unnecessary response 64 and reduces the deterioration of the attenuation characteristic outside the passband as in the filters B, B', C, and C' of the first embodiment.

As in the filters B' and C', the wiring line 34 or 36 including no separation part 46 may include no capacitor element. In this structure, the wiring line 34 or 36 is a line conductive in direct current. A resistor or the like may be connected in series with the wiring line 34 or 36.

As in the filters B and C, the capacitor Ca or Cb is located in series in the wiring line 34 or 36 (the other of the first wiring line and the second wiring line) without the separation part 46. This structure enables to adjust the amplitude of the signal 56 in the receive band 62 by the capacitance of the capacitor Ca or Cb.

The capacitor Ca or Cb (a capacitor element) includes a pair of the comb-shaped electrodes 15 facing each other in a planar direction at the distance D3 less than the distance D1. This structure enables to make the capacitance of the capacitor Ca or Cb greater than the parasitic capacitance Cf. Accordingly, the amplitude of the signal 56 in the receive band 62 is further adjusted.

The electrodes facing each other in the planar direction may not be necessarily the comb-shaped electrodes 15, but the use of the comb-shaped electrodes 15 for the electrodes facing each other in the planar direction reduces the size of the capacitor Ca or Cb.

As in the filters B and B', when the longitudinally coupled resonator 42 is located at the side, at which the transmit pad Ptx is located, of the region 38, the separation part 46 is preferably located at the side at which the common pad Pant is located. That is, the separation part 46 is preferably located in the second wiring line. This structure further improves the attenuation characteristic.

The resonator most adjacent to the wiring line 36 may be the series resonators S1 through S4 or the parallel resonators P1 through P3. The signal 54 passing through the ladder-type filter 51 mainly passes through the series resonators S1 through S4. Thus, the wiring lines 34 and 36 are preferably most adjacent to a part of a series resonator of the series resonators S1 through S4 and the parallel resonators P1 through P3. This structure allows the signals 56 and 54 to cancel each other.

The wiring lines 34 and 36 are preferably most adjacent to the series resonator S4 located closest to the common pad Pant among the series resonators S1 through S4. This structure allows the signals 56 and 54 to cancel each other at the common pad Pant side.

The wiring lines 34 and 36 and the longitudinally coupled resonator 42 generate the signal 56 that cancels the signal 54 in other than the passband of the filter, the signal 54 passing through the series resonators S1 through S4 and the parallel resonators P1 through P3 from the transmit pad Ptx to the common pad Pant. This structure causes the signals 56 and 54 to cancel each other, and thereby reduces the deterioration of the attenuation characteristic in other than the passband.

The first embodiment and the variations thereof describe the duplexer including the transmit filter 50 and the receive filter 52 as an example. However, the duplexer may be a duplexer including transmit filters or a duplexer including receive filters. The multiplexer may be a triplexer or a quadplexer instead of the duplexer.

Although the embodiments of the present invention have been described in detail, it is to be understood that the various change, substitutions, and alterations could be made hereto without departing from the spirit and scope of the invention.

What is claimed is:
1. A filter comprising:
a piezoelectric substrate;
an input pad located on the piezoelectric substrate;
an output pad located on the piezoelectric substrate;
a series resonator located in a region, which is sandwiched between the input pad and the output pad and is located on the piezoelectric substrate, and electrically connected in series with a path between the input pad and the output pad;
a parallel resonator located in the region, a first end of the parallel resonator being electrically connected to the path and a second end of the parallel resonator being electrically connected to a ground;
a longitudinally coupled acoustic wave resonator located on the piezoelectric substrate, the longitudinally coupled acoustic wave resonator being located at a side at which one pad of the input pad and the output pad is located with respect to the region;

a first wiring line located on the piezoelectric substrate and connecting the one pad to the longitudinally coupled acoustic wave resonator, the first wiring line being connected in parallel with the path between the input pad and the output pad;

a second wiring line located on the piezoelectric substrate and connecting the other pad of the input pad and the output pad to the longitudinally coupled acoustic wave resonator, the second wiring line being connected in parallel with the path between the input pad and the output pad; and a separation part located in one of the first wiring line and the second wiring line, the separation part separating the one of the first wiring line and the second wiring line into a first part and a second part in a planar direction, a shortest distance between the first part and the second part being greater than a shortest distance among a shortest distance between the first wiring line and the series resonator, a shortest distance between the first wiring line and the parallel resonator, a shortest distance between the second wiring line and the series resonator and a shortest distance between the second wiring line and the parallel resonator.

2. The filter according to claim 1, further comprising:
a capacitor element located in series in the other of the first wiring line and the second wiring line on the piezoelectric substrate.

3. The filter according to claim 2, wherein
the capacitor element includes a pair of electrodes facing each other in the planar direction at a distance less than the shortest distance.

4. The filter according to claim 3, wherein
the pair of electrodes facing each other includes a pair of comb-shaped electrodes facing each other.

5. The filter according to claim 1, wherein
the first wiring line and the second wiring line are most adjacent to a part of the series resonator of the series resonator and the parallel resonator.

6. The filter according to claim 5, wherein
the series resonator is provided in a plurality, and
the first wiring line and the second wiring line are most adjacent to a series resonator closest to the the other pad among the plurality of the series resonators.

7. The filter according to claim 1, wherein
the separation part is located in the second wiring line.

8. The filter according to claim 1, wherein
each of the series resonator and the parallel resonator includes an IDT.

9. The filter according to claim 1, wherein
the first wiring line, the second wiring line, and the longitudinally coupled acoustic wave resonator generate a signal that cancels a signal in other than a passband of the filter, the signal in other than the passband of the filter passing through the series resonator and the parallel resonator from the input pad to the output pad.

10. A multiplexer comprising:
a filter including:
a piezoelectric substrate;
an input pad located on the piezoelectric substrate;
an output pad located on the piezoelectric substrate;
a series resonator located in a region, which is sandwiched between the input pad and the output pad and is located on the piezoelectric substrate, and electrically connected in series with a path between the input pad and the output pad;
a parallel resonator located in the region a first end of the parallel resonator being electrically connected to the path and a second end of the parallel resonator being electrically connected to a ground;
a longitudinally coupled acoustic wave resonator located on the piezoelectric substrate, the longitudinally coupled acoustic wave resonator being located at a side at which one pad of the input pad and the output pad is located with respect to the region;
a first wiring line located on the piezoelectric substrate and connecting the one pad to the longitudinally coupled acoustic wave resonator, the first wiring line being connected in parallel with the path between the input pad and the output pad;
a second wiring line located on the piezoelectric substrate and connecting the other pad of the input pad and the output pad to the longitudinally coupled acoustic wave resonator, the second wiring line being connected in parallel with the path between the input pad and the output pad; and
a separation part located in one of the first wiring line and the second wiring line, the separation part separating the one of the first wiring line and the second wiring line into a first part and a second part in a planar direction, a shortest distance between the first part and the second part being greater than a shortest distance among a shortest distance between the first wiring line and the series resonator, a shortest distance between the first wiring line and the parallel resonator, a shortest distance between the second wiring line and the series resonator and a shortest distance between the second wiring line and the parallel resonator.

* * * * *